United States Patent
Soe

(10) Patent No.: US 9,088,308 B2
(45) Date of Patent: Jul. 21, 2015

(54) FREQUENCY PULLING REDUCTION IN WIDE-BAND DIRECT CONVERSION TRANSMITTERS

(71) Applicant: Tensorcom, Inc., Carlsbad, CA (US)

(72) Inventor: Zaw Soe, Encinitas, CA (US)

(73) Assignee: Tensorcom, Inc., Carlsbad, CA (US)

( * ) Notice: Subject to any disclaimer, the term of this patent is extended or adjusted under 35 U.S.C. 154(b) by 101 days.

(21) Appl. No.: 13/789,682

(22) Filed: Mar. 8, 2013

(65) Prior Publication Data

US 2014/0254710 A1 Sep. 11, 2014

(51) Int. Cl.
*H04L 27/00* (2006.01)
*H04B 1/02* (2006.01)

(52) U.S. Cl.
CPC ........................................ *H04B 1/02* (2013.01)

(58) Field of Classification Search
CPC .................................... H04B 1/16; H04B 1/30
USPC .......................................................... 375/295
See application file for complete search history.

(56) References Cited

U.S. PATENT DOCUMENTS

| | | | |
|---|---|---|---|
| 2005/0266806 A1* | 12/2005 | Soe et al. ........................ | 455/88 |
| 2010/0325669 A1* | 12/2010 | Tsai et al. ....................... | 725/68 |
| 2013/0266045 A1* | 10/2013 | Lakkis .......................... | 375/219 |

OTHER PUBLICATIONS

47 CFR § 15.257 Operation within the band 57—64 GHz.
"Behavioral Models of Frequency Pulling in Oscillators" by M. Esmaeil Heidari and A. A. Abidi, http://www.bmas-conf.org/2007/4-1_paper.pdf, pp. 100-104, 2007.
"VCO Load Pull Efects in Phase Locked Loops", by Chuck Cook, http://home.earthlink.net/~cmcook3/qucs/VCOloadPull.pdf.
"Transmitter Design issues", Class notes ucsb.edu, http://www.ece.ucsb.edu/yuegroup/Teaching/ECE594BB/Lectures/Wireless%20Transmitter%20Arch.pdf.

* cited by examiner

*Primary Examiner* — Shuwang Liu
*Assistant Examiner* — Gina McKie
(74) *Attorney, Agent, or Firm* — Steven J Shattil

(57) ABSTRACT

In an up-converter path of a transmitter, wide-band signal system like direct conversion WiGig, a high pass filter (HPF) is placed in the baseband path after the low pass filter (LPF) but before the mixers. The baseband signal of WiGig can have a bandwidth of 800 MHz. The HPF removes the frequencies from 0-40 MHz from the baseband signal and degrades the overall signal of the baseband by a dB or so. However, the frequency pulling is significantly reduced since oscillator frequency and Radio frequency (RF) transmitter frequencies after conversion become further separated when compared a system using to the conventional approach. This causes the injected signal to fall outside the locking range of the oscillator. The concern of substrate coupling is reduced and allows for a reduction in the physical distance between the oscillator and the mixer and reduces a shift in the desired target frequency of operation.

14 Claims, 5 Drawing Sheets

FREQUENCY PULLING REDUCTION IN WIDE-BAND DIRECT CONVERSION TRANSMITTERS

BACKGROUND OF THE INVENTION

The present application is related to and co-filed with to the U.S. application Ser. No. 13/789,681 entitled "Gilbert Mixer with Negative gm to Increase NMOS Mixer Conversion" filed on Mar. 8, 2011 which is assigned to the same assignee as the present application and incorporated herein by reference in its entirety and the present application is related to the U.S. application Ser. No. 13/312,820 entitled "Injection Locked Divider with Injection Point Located at a Tapped Inductor" filed on Dec. 6, 2011 which is assigned to the same assignee as the present application and invented by the same inventor as the present application and incorporated herein by reference in its entirety and Ser. No. 13/442,387 entitled "Method and Apparatus of Transceiver Calibration Using Substrate Coupling" filed on Apr. 9, 2012, which is assigned to the same assignee as the present application and incorporated herein by reference in its entirety.

Federal Communications Commission (FCC) has allotted a spectrum of bandwidth in the 60 GHz frequency range (57 to 64 GHz). The Wireless Gigabit Alliance (WiGig) is targeting the standardization of this frequency band that will support data transmission rates up to 7 Gbps. Integrated circuits, formed in semiconductor die, offer high frequency operation in this millimeter wavelength range of frequencies. Some of these integrated circuits utilize Complementary Metal Oxide Semiconductor (CMOS). Silicon-Germanium (SiGe) or GaAs (Gallium Arsenide) technology to form the dice in these designs. At 60 GHz, a divider of a clock signal providing a 30 GHz is an important building block. Another important consideration is locking or syncing the on-chip oscillator to a second independent clock signal.

CMOS (Complementary Metal Oxide Semiconductor) is the primary technology used to construct integrated circuits. N-channel devices and P-channel devices (MOS device) are used in this technology which uses fine line technology to consistently reduce the channel length of the MOS devices. Current channel lengths are 40 nm, the power supply of VDD equals 1.2V and the number of layers of metal levels can be 8 or more.

Oscillator and frequency dividers are elements in communication systems. The highest performance circuits in a given technology are usually measured in some form of an on-chip free running oscillator, such as a ring oscillator using transistors or a resonant oscillator that uses transistors and reactive components in a regenerative connection. Once these clocks are generated on-chip, a Phase Lock Loop (PLL) can be used to control the frequency of operation as is well known in the art.

Direct conversion transceiver mixes an oscillator frequency with a baseband signal to generate a carrier frequency of the signal which is substantially identical to the oscillator frequency. This modulation is called up-conversion. A particular problem in direct conversion is frequency pulling and locking of a first clock signal from an on-chip oscillator due to a second clock signal with a frequency close to that of the on-chip oscillator. This is known as clock injection. This second independent clock signal can lock and shift the frequency of operation of the first clock signal away from the design parameters. An injection locked on-chip oscillator has a range of frequencies that the oscillator will lock on to (the locking range) In addition, the locking can be a problem in direct conversion transmitters.

High frequency signals as used in WiGig transceivers have carrier frequencies around 60 GHz. In addition, parasitic capacitance plays an influential role in the performance of electrical circuits The drain/gate capacitance is about 10 fF per micron width while the wire used to interconnect the drain to the inductor can have an inductance of 1 pH/μm. In particular, this parasitic capacitance can degrade the operation of on-chip clock oscillators, which are typically the components on a chip that achieve the highest frequency capabilities. In addition, the skin effect causes resistive losses as the length of the interconnect increases.

The injection of the second clock signal into the oscillator of the first clock signal can occur through the substrate conductance or through free space by inductive and/or capacitive coupling. One apparent technique would be separating the oscillator from the source of the second signal by using distance. However, as mentioned earlier, at 60 GHz, the parasitic inductance, capacitance and resistance of the increased interconnect length degrades the performance of the transceiver.

BRIEF SUMMARY OF THE INVENTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

One of the embodiments positions a high pass filter (HPF) in the baseband path after the low pass filter (LPF). For wide-band signal systems like WiGig which use direct conversion, the baseband signal can have a bandwidth from approximately DC to 800 MHz. The HPF removes the frequencies from 0-40 MHz from the baseband signal and degrades the signal by a dB or so. However, the frequency pulling is significantly reduced since the oscillator frequency and the op-converted RF transmitter frequencies are separated by 40 MHz and cause the injected signal to fall outside the locking range.

Another embodiment of the invention allows a reduction in the physical distance between the oscillator and the mixer. In addition, the substrate coupling effect has been reduced. This distance can be in range of 10 μm or so, and this distance can change the parasitic inductance by 10 pH and when compared to the inductance of the desired inductor of 180 pH. This is a significant fraction of the overall inductance in the circuit. This length also changes the parasitic capacitance and together the parasitic inductance and parasitic capacitance can cause a shift in the desired target frequency of operation.

A direct conversion up-conversion apparatus comprising an oscillator signal with a first frequency coupled to a mixer, a wide-band signal with a frequency range from DC to a second frequency provided by a baseband path, the baseband path coupled to a high pass filter, the high pass filter has a cutoff frequency equal to a third frequency, the high pass filter coupled to the mixer, a substrate-reactive coupled network couples a partial amplitude of the frequency range of an up-converted signal into an oscillator and a minimum of a frequency band of the up-converted signal and the first frequency of the oscillator are separated by the third frequency. The third frequency is equal to a locking range of the oscillator. The apparatus whereby said baseband path comprises a digital baseband signal coupled to a digital-to-analog converter, the digital-to-analog converter coupled to an adjustable gain amplifier and the adjustable gain amplifier coupled to a low pass filter. The apparatus further comprising, a pre-driver stage driven by the up-converted signal, the pre-driver stage coupled to a power amplifier and the power amplifier coupled to an antenna. The apparatus further comprising a frequency adjust circuit formed with an adjustable capacitance. The apparatus further comprising a reference external frequency coupled to a feedback loop, a control signal from the feedback loop coupled to the oscillator and a high frequency oscillation signal coupled from the oscillator to the feedback loop.

A wide-band direct conversion transmitter comprising a wide-band differential i-signal with a frequency range from DC to a first frequency provided by an i-baseband path, the i-baseband path coupled to a first and a second high pass filter, a wide-band differential q-signal with the frequency range from DC to the first frequency provided by a q-baseband path, the q-baseband path coupled to a third and a fourth high pass filter, a differential in-phase oscillation with a second frequency and a differential quadrature oscillation with the second frequency generated by a quadrature oscillator, the first and the second high pass filters coupled to a first mixer, the third and the fourth high pass filters coupled to a second mixer, all high pass filters have a cutoff frequency equal to a third frequency a substrate-reactive coupled network couples a partial amplitude of the frequency range of an up-converted signal into the quadrature oscillator and a minimum of a frequency band of the up-converted signal and the second frequency are separated by the third frequency. The third frequency is equal to a locking range of the quadrature oscillator. The transmitter further comprising the up-converted signal is a summation of outputs of the first and the second mixer driving a common load. The transmitter further comprising a frequency adjust circuit formed with an adjustable capacitance. The transmitter further comprising a pre-driver stage driven by the up-converted signal, the pre-driver stage coupled to a power amplifier and the power amplifier coupled to an antenna. The transmitter whereby each baseband path comprises a digital baseband signal coupled to a digital-to-analog converter, the digital-to-analog converter coupled to an adjustable gain amplifier and the adjustable amplifier coupled to a low pass filter. The transmitter further comprising a reference external frequency coupled to a feedback loop, a control signal from the feedback loop coupled to the quadrature oscillator and a high frequency oscillation signal coupled from the quadrature oscillator to the feedback loop.

A method of separating a minimum of a frequency band of a primary up-converted signal and a second frequency by a third frequency comprising the steps of coupling an i-baseband path with a wide-band differential i-signal with a frequency range from DC to the first frequency provided to a first and a second high pass filter, coupling a q-baseband path with a wide-hand differential q-signal with the frequency range from DC to the first frequency provided to a third and a fourth high pass filter, generating an differential in-phase oscillation signal with the second frequency and a differential quadrature oscillation signal with the second frequency by a quadrature oscillator, coupling the first and the second high pass filters to a first mixer, coupling the third and the fourth high pass filters to a second mixer, having all high pass filters with a cutoff frequency equal to the third frequency, coupling a partial amplitude of the frequency range of the primary up-converted signal through a substrate-reactive coupled network into the quadrature oscillator and separating a minimum of the frequency band of the primary up-converted signal and the second frequency by the third frequency. The method whereby setting the third frequency equal to a locking range of the quadrature oscillator. The method comprising the steps of summing an output of a first up-converted signal from the first mixer with an output of a second up-converted signal from the second mixer to generate the primary up-converted signal. The method further comprising the steps of adjusting a frequency circuit formed with an adjustable capacitance. The method further comprising the steps of driving a pre-driver stage by the primary up-converted signal, coupling the pre-driver stage to a power amplifier and coupling the power amplifier to an antenna. The method further comprising the steps of coupling a digital baseband signal to a digital-to-analog converter, coupling the digital-to-analog converter to an adjustable gain amplifier and coupling the adjustable gain amplifier to a low pass filter. The method further comprising the steps of applying a reference external frequency to a feedback loop, coupling a control signal of the feedback loop to the quadrature oscillator and coupling a high frequency oscillation from the oscillator to the feedback loop.

BRIEF DESCRIPTION OF THE DRAWINGS

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be through and complete, and will fully convey the scope of the invention to those skilled in the art. In other instances, well-known structures and functions have not been shown or described in detail to avoid unnecessarily obscuring the description of the embodiment of the invention. Like numbers refer to like elements in the diagrams.

DETAILED DESCRIPTION OF THE INVENTION

Figure 1A:
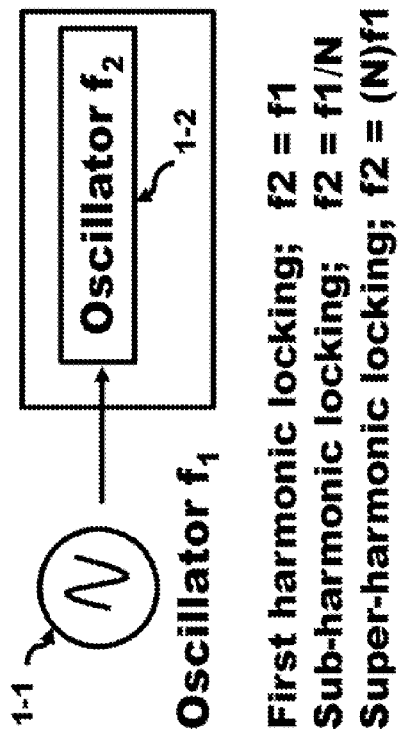
FIG. 1A depicts two oscillators on a die where one oscillator can injection lock to a second oscillator.

FIG. 1A illustrates an on-chip oscillator operating at a frequency of $f_1$ and a second on-chip oscillator operating at a frequency of $f_2$. On the same die. Assume for the moment that these oscillators are resonant oscillators. A resonant oscillator or circuit comprises at least one inductor and at least one capacitor. The inductors can have a parasitic capacitance, a static capacitance, and possibly a controlled capacitance (electrically) and together with said inductors form a resonant circuit. The substrate of the die couples the signal from the first oscillator to the second oscillator. If the two frequencies are within the locking range of each other, the frequencies of the two oscillators will become locked and synchronized, thereby operating at the same or multiple frequencies of each other.

Depending on the system requirement, this feature of being locked in frequency between two on-chip oscillators may or may not be desirable. If the intent is undesirable, then the locking of the two oscillators can cause system failure. For example, an on-chip oscillator at one corner of the chip can lock with another supposedly independent on-chip oscillator at a different area or section of the chip. The frequency shift of the second independent on-chip oscillator may cause this section of the chip to generate errors.

Figure 1B:
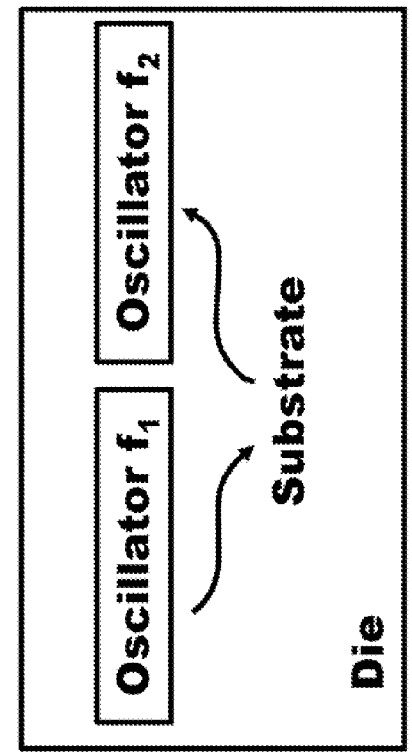
FIG. 1B shows an external signal from a first oscillator injection locking an oscillator.

The three categories of locking in a free running oscillator are presented in FIG. 1B. A clock 1-1 operating at $f_1$ is applied to a free running oscillator 1-2 operating at a first frequency of $f_2$. The on-chip oscillator 1-2 can be either locked to the first harmonic ($f_2 = f_1$), locked sub-harmonically $f_2 = (f_1)/N$, or locked super-harmonically $f_2 = (N)(f_1)$.

The highest clock signal in WiGig has such a short duration (16 ps) at 60 GHz and would require a resonant oscillator to create this frequency in CMOS. The delay through the 40 nm MOS device is about the shortest delay that can be achieved in this technology for a single device. Any computational unit being clocked by this signal such as a divider formed using conventional CMOS gates (NAND, NOR, FF, etc.) formed of several devices would typically fail since the required duration is longer than 16 ps However, for a custom designed computational block (See patent application Ser. No. 13/243, 908 "A High Performance Divider Using Feed Forward, Clock Amplification and Series Peaking Inductors" filed on Sep. 23, 2011 by the same inventor as this application), inventive techniques can be incorporated into a custom design to create custom CMOS gates that operate within the 16 psec period.

Figure 2:
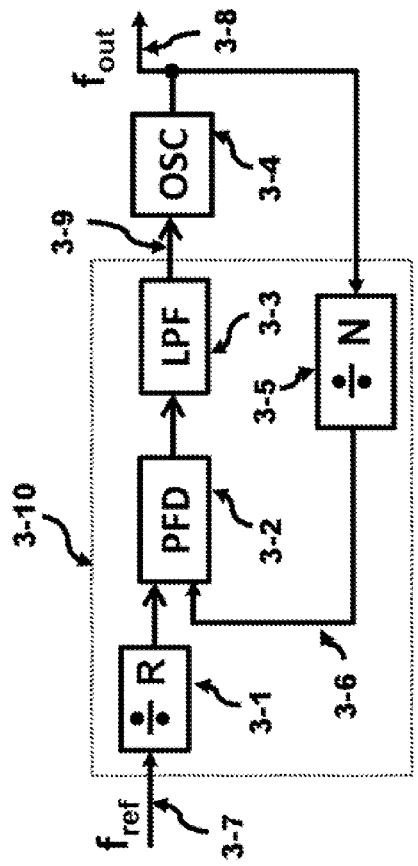
FIG. 2 graphs a plot of the locking range of an injection locked oscillator.

The locking range for the first harmonic is illustrated in FIG. 2. The locking range is defined and ranges from $\omega_1$ to $\omega_h$. If the external clock signal lies within this range, the free running oscillator locks to the stimulus frequency, otherwise, the oscillator fails to lock. The free running oscillator also opens the locking range to any other undesirable dominant stimulus that may be created on-chip within this frequency range to upset the initial desired intent of locking to the second clock signal If the undesired signal is captured by the free running oscillator in place of the second clock signal, then the oscillator may not lock as initially desired.

Figure 3:
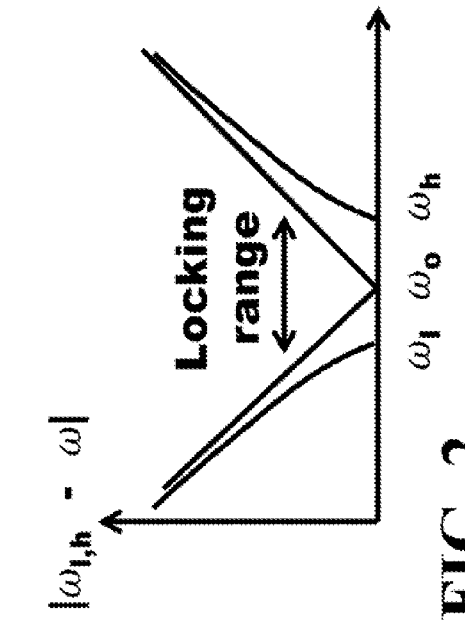
FIG. 3 depicts a block diagram of a Voltage controlled oscillator.

FIG. 3 illustrates a conventional PLL. The reference external frequency 3-7 of $f_{ref}$ is divided down by R in block 3-1. The low frequency signal is compared in the PDF (Phase and Frequency Detector) 3-2 against the divided oscillator signal 3-6. The OSC 3-4 generates the high frequency oscillation 3-8 $f_{out}$. This high frequency oscillation is presented to the prescalar 3-5 and is divided by N and compared against a reference frequency in the PFD block 3-2. The output of the PFD is low pass filtered (LPF 3-3) to generate a DC voltage that is applied to the OSC to adjust the high frequency signal $f_{out}$. Another layer of frequency control is inserted into the free running oscillator by inserting the PLL between the free running oscillator and the reference external frequency $f_{ref}$. The PLL can provide a control loop 3-10 to adjust the frequency of the oscillator.

Figure 4:
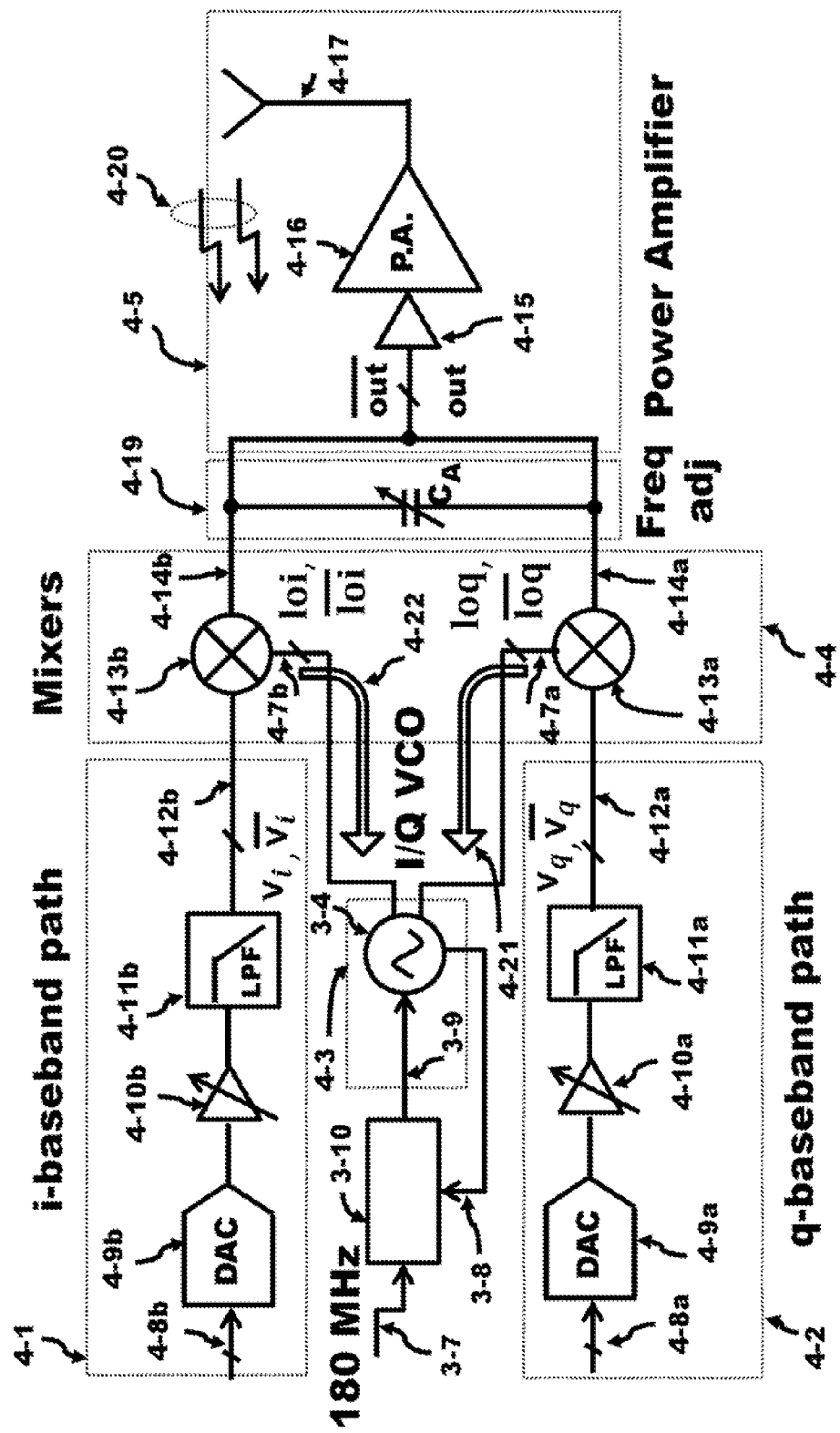
FIG. 4 depicts a block diagram for an I and Q up-converted transmit path of a Homodyne Transmitter with VCO pulling.

FIG. 4 illustrates an up-conversion communication signal path. There are two baseband signal paths; the i-baseband path 4-1 and the q-baseband path 4-2. The digital quadrature and in-phase input signal to both of these baseband paths (WiGig has a bandwidth from approximately DC to 800 MHz) are applied at 4-8a and 4-8b, respectively, which are then applied to the digital-to-analog converter (DAC) 4-9a and 4-9b, respectively. Adjustable gain amplifiers 4-10a and 4-10b amplify and apply the output of the digital-to-analog converters to the low pass filters (LPF) 4-11a and 4-11b. The output of the low pass filter 4-11a generates a quadrature voltage $V_q$ and an inverse quadrature voltage $\overline{V_q}$ as illustrated on the line 4-12a. The output of the low pass filter 4-11b generates the in-phase voltage $V_i$ and an inverse in-phase voltage $\overline{V_i}$ as illustrated on the line 4-12b.

An adjustable quadrature oscillator 3-4 generates a frequency at about 60 GHz and is illustrated in the dotted box 4-3. A differential in-phase oscillation signal loi and its inverse $\overline{loi}$ are generated on line 4-7b while a differential quadrature oscillation signal loq at its inverse $\overline{loq}$ are generated on lines 4-7a. The wide-band differential i-signal outputs 4-12b of the i-baseband path 4-1, the wide-band differential q-signal outputs 4-12a of the q-baseband path 4-2 and the oscillator 4-3 outputs 4-7a and 4-7b at a frequency of about 60 GHz are applied to the Gilbert mixer block 4-4. The output of the Gilbert mixer is coupled to a frequency adjust circuit 4-19 to adjust the frequency of the Gilbert mixer outputs out 4-14a and $\overline{out}$ 4-14b which are then coupled to the input, of the power amplifier 4-5.

FIG. 4 depicts that the quadrature oscillator 3-4 is part of a feedback loop in a PLL comprising the reference frequency 3-7 at 180 MHz, the feedback loop 3-10. The control signal 3-9 and the reference frequency from the quadrature oscillator 3-8. The mixer feedback signals 4-21 and 4-22 provide partial amplitude of the frequency range of the up-converted i and q signals, respectively, through a substrate-reactive coupled network into the quadrature oscillator. This causes an injection into the quadrature oscillator, potentially creating frequency pulling and shifting the frequency of oscillation undesirably. The source of this injection is the signal in the two (i and q) baseband paths and the feedback signal from the antenna 4-20. Proper shielding can help reduce the coupling of the feedback signal from the antenna but there still is a path of improper matching in the transmit line.

The wide-band differential i-signals 4-12b from the i-baseband path 4-1 and the differential in-phase oscillator signals and its inverse 4-7b are applied to the Gilbert mixer 4-13b. The wide-band differential i-signals of output 4-12b consist of $V_i$ and $\overline{V_i}$. The differential in-phase oscillator signals at a frequency about 60 GHz are called loi and $\overline{loi}$. The output of the Gilbert mixer 4-13b generates the signal $\overline{out}$ 4-14b and the signal out 4-14a. The wide-band differential q-signals 4-12 a from the q-baseband path 4-2 and the differential quadrature oscillator signal and its inverse output 4-7a are applied to the Gilbert mixer 4-13a The wide-band differential q-signals 4-12a consists of the quadrature voltage $V_g$ and an inverse quadrature voltage voltage $\overline{V_q}$. The differential oscillator outputs 4-7a are called signal loq at its inverse $\overline{loq}$. The output of the Gilbert mixer 4-13a generates the signal out 4-14a and the signal $\overline{out}$ 4-14b. The current signals of out 4-14a and $\overline{out}$ 4-14b from both mixers 4-13b and 4-13a are summed together to generate the output signal $\overline{out}$ 4-14b and the output signal out 4-14a. After summation, the resultant signal is called the primary up-converted signal. This signal is comprised of the inverted and non-inverted signal, The frequency adjust circuit 4-19 consists of an adjustable capacitor $C_A$. The adjustment of the capacitor occurs by applying a variable voltage to $C_A$ which changes the parameters of the capacitor presented to the output signals out 4-14*a* and $\overline{\text{out}}$ 4-14*h* of the Gilbert mixer 4-4. The variation of the capacitance value allows the frequency of the tank circuit coupled to the Gilbert mixer to be adjusted.

The differential output signals out 4-14*a* and $\overline{\text{out}}$ 4-14*b* are applied to the power amplifier 4-5. Inside the power amplifier 4-5, these two signals are presented to the pre-driver 4-15 which amplifies the signal as well as perform impedance matching before being coupled to the input of the final power amplifier 4-16. The output of the power amplifier 4-16 is coupled to an antenna 4-17.

Figure 5:
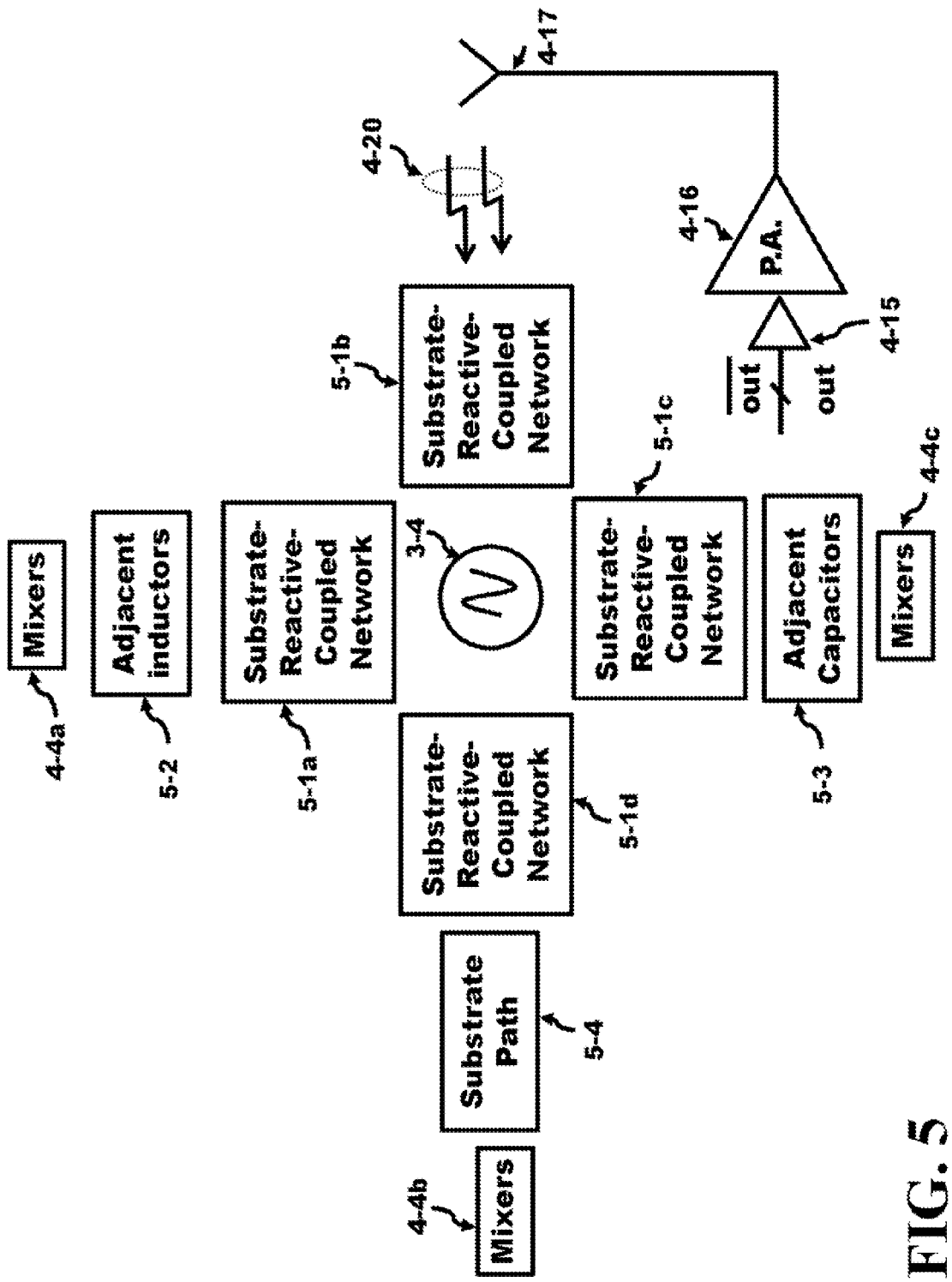
FIG. 5 depicts a block diagram illustrating several possible ways an injected signal of the mixer may lock an oscillator in accordance with the present invention

FIG. 5 illustrates several examples where injection of a second signal may occur to a quadrature oscillator 3-4. The oscillator 3-4 is in the center of the diagram. The mixers 4-4*a* introduce magnetic coupling through an adjacent inductor 5-2 located in the Substrate Reactive-Couple Network 5-1*a*. A second way is when the mixers 4-4*b* introduce current into a Substrate Path 5-4 located in the Substrate Reactive-Couple Network 5-1*d* to the oscillator 3-4. A third way is when the mixers 4-4*c* introduce a coupling through an adjacent capacitor 5-3 located in the Substrate Reactive-Couple Network 5-1*c* to the oscillator 3-4. Finally the fourth way is when the antenna 4-17 and PA 4-16 introduce magnetic coupling through free-space carrier waves 4-20 through an inductor in the Substrate Reactive-Couple Network 5-1*b* to the oscillator.

Figure 6A:
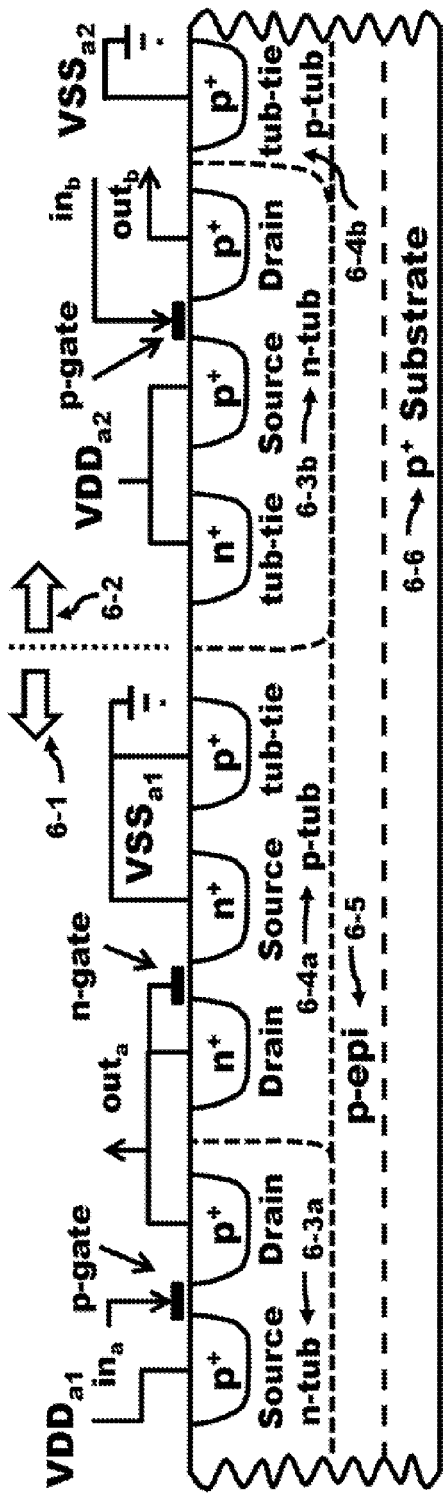
FIG. 6A illustrates a cross-sectional view of a conventional CMOS die comprising P channels, N channels, n-tubs, p-tubs, epi layer and $p^+$ starting substrate.

FIG. 6A depicts a cross-sectional version of a CMOS conventional die. The die is partitioned by the vertical dotted line where everything to the left 6-1 is illustrated as not being metallically coupled to anything to the right of the dotted line 6-2. This provides the definition of isolated; all metallization to the left 6-1 of the dotted line is isolated from all metallization to the right 6-2 of the dotted line. Also shown is the $p^+$ substrate 6-6 onto which a layer of p-epi 6-5 is deposited. P-tubs and n-tubs are formed within the p-epi layer. The p-tub 6-4*a* contains at least one N-channel transistor with an $n^+$ drain region and $n^+$ source region along with a $p^+$ tub-tie biasing the tub. The n-tub 6-3*a* contains at least one P-channel transistor having a $p^+$ source region and a $p^+$ drain region; however, an n+ tub-tie is typically used to bias the n tub (currently illustrated). On the right hand side 6-2 of the dotted line an a-tub 6-3*b* and a p-tub 6-4*b* are shown. Within the n-tub 6-3*b*, there is at least one P-channel device having a $p^+$ source region and a $p^+$ drain region, in addition, an $n^+$ tub-tie to bias the tub is illustrated. Although the p-tub 6-4*b* contains N-channel transistors, none are depicted, instead a $p^+$ tub-tie is illustrated which is used to bias the tub.

Figure 6B:
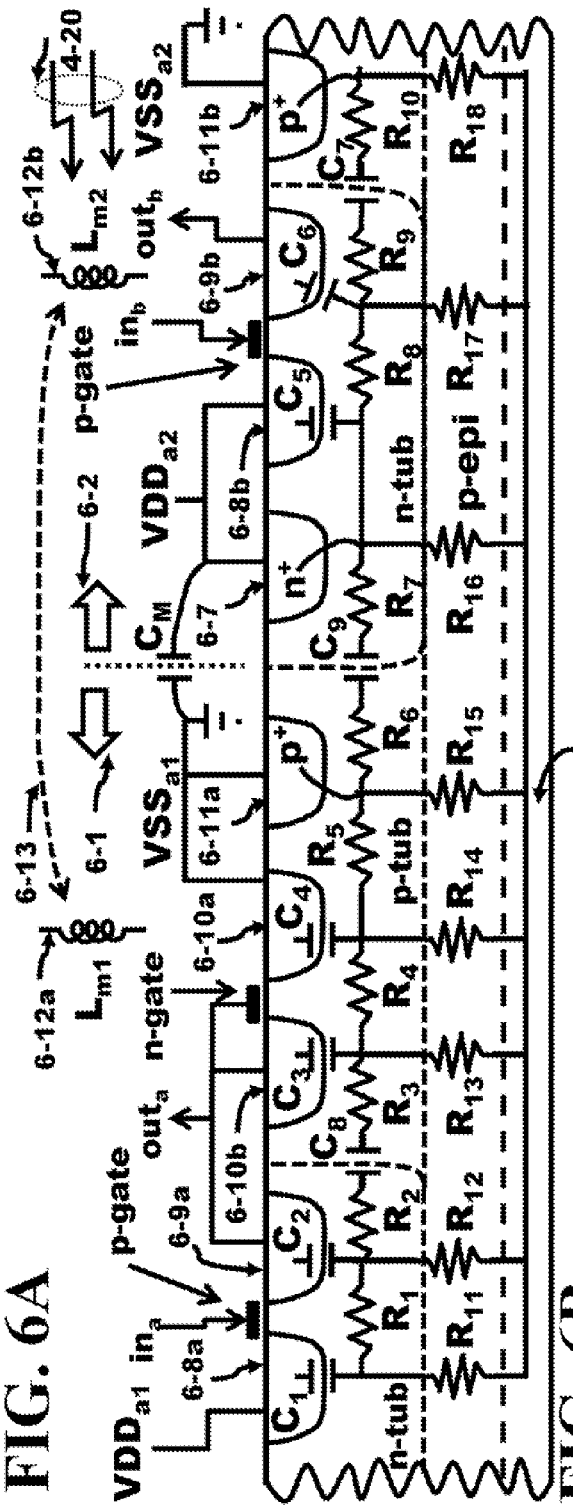
FIG. 6B presents the cross-sectional view of the conventional CMOS die illustrating the resistive, resistive-capacitive, capacitive and inductive substrate network coupling the CMOS devices together.

The metallization layer is described using both FIG. 6A and FIG. 6B by starting from the far left. The source $p^+$ source region 6-8*a* is connected to $VDD_{a1}$. Although the $n^+$ tub-tub is not illustrated, the $n^+$ tub-tie would be used to bias the tub. This P-channel transistor is self-aligned by the p-gate that is coupled to the input signal, $in_a$, and the $p^+$ drain region 6-9*a* is connected to the $n^+$ drain region 6-10*b* in the p-tub 6-4*a*, as well as, the n-gate of the n-channel which is used to self-align the $n^+$ drain region 6-10*b* from the $n^+$ source region 6-10*a*. This metal mode is also labeled as the $out_a$ node. The source 6-10*a* of the N-channel is coupled to the $p^+$ tub-tie 6-11*a* and connected to $VSS_{a1}$. Next, the right hand 6-2 side of the dotted line is described. A second power supply called $VDD_{a2}$, independent from $VDD_{a1}$, is connected to the $p^+$ source region 6-8*b* of a P-channel device and the $n^+$ tub-tie 6-7. The p-gate self-aligns the drain 6-9*b* from the source 6-8*b* in the P-channel transistor. The p-gate is coupled to $in_b$ while the output of the P-channel transistor $out_b$ is generated at the drain 6-9*b*. Finally, the $p^+$ tub-tie 6-11*b* in the p-tub 6-4*b* is coupled to $VSS_{a2}$.

The resistive-capacitive and resistive coupling paths within the body of the substrate are described next. Although the coupling network illustrates one particular mesh configuration, the modeling can be made more or less complicated to suit the needs of the user. A diode exists between opposite polarity doped regions and the diode has a capacitance associated with it. For example, the $p^+$-doped source of the P-channel 6-8*a* forms a diode capacitance $C_1$ with the n-doped n-tub 6-3*a*. Similarly, capacitances $C_2$, $C_5$ and $C_6$ have the same type of characteristics. In addition, the $n^+$-doped source of the N-channel 6-10*a* forms a diode capacitance $C_4$ with the p-doped p-tub 6-4*a*. Similarly, capacitance $C_3$ has the same characteristics. Finally, a diode forms between the different polarities' tubs providing another type of capacitance. The n-doped region of the n-tub 6-3*a* forms a capacitance $C_8$ with the p-tub 6-4*a*. Similarly, $C_9$ and $C_7$ have the same type of capacitance.

A resistive network couples all these capacitors together. For example, the source of the P-channel 6-8*a* is coupled to a capacitor $C_1$ to $R_1$ to $C_2$ of the drain of the transistor. This path can be extended to $R_2$, $C_8$, $R_3$ and $C_3$ to the $n^+$ drain 6-10*b* of the N-channel in the p-tub 6-4*a*. Many possibilities exit for the coupling paths and are too extensive to cover all possibilities. For example, $C_1$ to $R_{11}$, to $R_{18}$ and the tub-tie 6-11*b*. The resistive mesh $R_1$-$R_{18}$ couples the capacitors $C_1$-$C_9$ together. One exception depicts the tub-tie 6-11*a* coupled to $VSS_{a1}$ being only resistively coupled to the tub-tie 6-11*b* coupled to $VSS_{a2}$; thus, the VSS tub-ties are only contacts that are resistive coupled to each other while the remaining paths between any other doped region includes at least one reactance in a series connection.

In addition, two additional reactances are illustrated in FIG. 6B: 1) the inductive coupling between $L_{m1}$ 6-12*a* and $L_{m2}$ 6-12*b* which can couple signals between the left and right sides and 2) $C_m$. $L_{m1}$ can represent the inductance of a portion of a metallic trace in the left side 6-1 while $L_{m2}$ can represent the inductance of a portion of a metallic trace in the right side 6-2. If one portion of a metallic trace carries current, then these two inductances can be magnetically coupled 6-13 together. Thus, the left 6-1 and right 6-2 portions of the die are no longer isolated. This coupling can occur in free space as well as within the substrate. The capacitance $C_m$ is the parasitic capacitance between the adjacent traces of the metallization of $VSS_{a1}$ and those of $VDD_{a2}$. Other capacitive reactance and inductive reactance due to metallic traces can exit between the assumed isolated sides of the die although they are not shown. The first reactance can be the magnetic coupling 6-13 between the mutual-inductance $L_{m1}$ 6-12*a* of a metal trace in the left side 6-1 to that of the mutual-inductance $L_{m2}$ 6-12*b* of a metal trace on the right side 6-2. FIG. 6B also illustrates the feedback 4-20 coming from the antenna 4-17. The electromagnetic signal is inductively coupled in a inductor such as $L_{m2}$.

Figure 7:
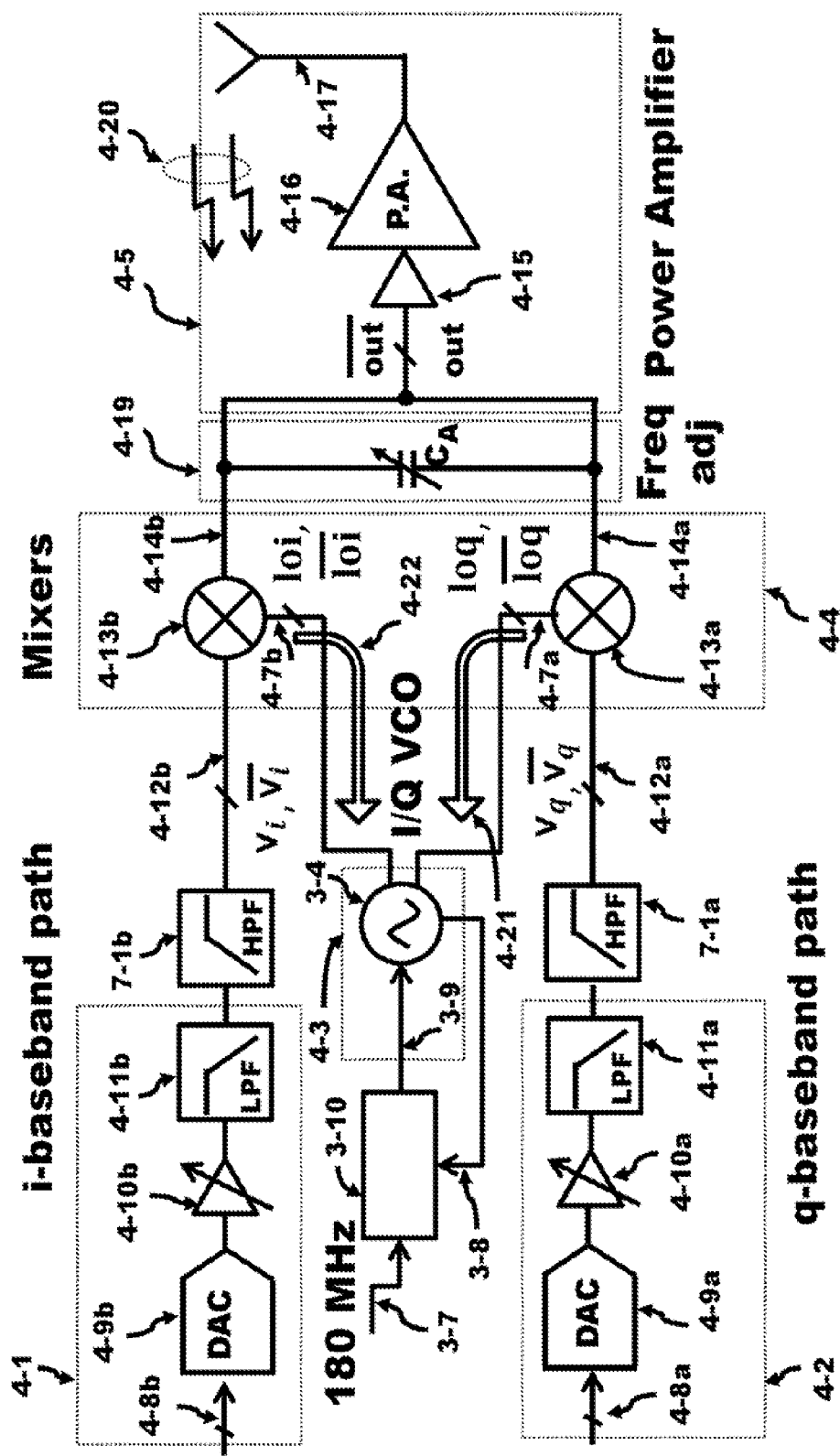
FIG. 7 depicts a block diagram an I and Q up-converted transmit path of a Homodyne Transmitter with VCO pulling where the inventive HPF reduces frequency pulling to in accordance with the present invention.

A circuit diagram representation of the invention is illustrated in FIG. 7. This circuit is identical to the circuit in FIG. 4 except that a HPF (7-1*a* and 7-1*b*) has been placed between the LPF (4-11*a* and 4-11*b*) and the mixers (4-13*a* and 4-13*b*) in both baseband paths. The HPF filters out the band of signals with a DC-40 MHz signal content (has a cutoff frequency of 40 MHz) of the 800 MHz signal. The separation between the oscillator frequency and a minimum of a frequency band of the up-converted signal after conversion is equal to the cutoff frequency. This frequency gap separates the oscillator frequency and RF transmitter frequencies. This frequency separation causes the injected signal of the minimum of the frequency band of the up-convened signal to have a reduced influence on pulling the frequency of the oscillator. If the cutoff frequency equals to the locking range of the oscillator then the frequency pulling can be significantly reduced for this innovation invention of the oscillator when compared to a system using to the conventional approach.

Finally, it is understood that the above descriptions are only illustrative of the principle of the current invention. Various alterations, improvements, and modifications will occur and are intended to be suggested hereby, and are within the spirit and scope of the invention. This invention may, however, be embodied in many different forms and should not he construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. For example, P-channels transformed into N-channels, VDD interchanges with VSS, voltages measured with respect to the other power supply, the position of current sources moved to the other power supply, etc. The semiconductor die can include silicon, germanium, SI graphite, GaAs, SIO, etc. Although the circuits were described using CMOS, the same circuit techniques can be applied to depletion mode transistors and BJT or biploar circuits, since this technology allows the formation of current sources and source followers. When a transistor is specified, the transistor can be a transistor such as an N-MOS or P-MOS. The CMOS or SOI (Silicon on Insulator) technology provides two enhancement mode channel types: N-MOS (N-channel) and P-MOS (P-channel) transistors or transistors. In addition, a network and a portable system can exchange information wirelessly by using communication techniques such as Time Division Multiple Access (TDMA) Frequency Division Multiple Access (FDMA), Code Division Multiple Access (CDMA), Orthogonal Frequency Division Multiplexing (OFDM), Ultra Wide Band (UWB), Wi-Fi, WiGig, Bluetooth, etc. The network can comprise the phone network, IP (Internet protocol) network, Local Area Network (LAN), ad hoc networks, local routers and even other portable systems.

What is claimed is:

1. A wide-band direct conversion transmitter comprising:
   a wide-band differential i-signal with a frequency range from DC to a first frequency provided by an i-baseband path, the i-baseband path coupled to a first low pass filter and a first high pass filter;
   a wide-band differential q-signal with the frequency range from DC to the first frequency provided by a q-baseband path, the q-baseband path coupled to a second low pass filter and a second high pass filter;
   a differential in-phase oscillation with a second frequency and a differential quadrature oscillation with the second frequency generated by a quadrature oscillator, wherein the oscillations generated by the quadrature oscillator are coupled to a first and a second mixer;
   the first low pass filter and the first high pass filter coupled to the first mixer;
   the second low pass filter and the second high pass filter coupled to the second mixer, wherein all high pass filters have a cutoff frequency equal to a third frequency; and
   a substrate-reactive coupled network couples a partial amplitude of the frequency range of an up-converted signal into the quadrature oscillator, wherein
   the second frequency is separated from a minimum of a frequency band of the up-converted signal by the third frequency.

2. The transmitter of claim 1, wherein
   the third frequency is equal to a locking range of the quadrature oscillator.

3. The transmitter of claim 1, further comprising:
   the up-converted signal is a summation of outputs of the first and the second mixer driving a common load.

4. The transmitter of claim 3, further comprising:
   a frequency adjust circuit formed with an adjustable capacitance.

5. The transmitter of claim 1, further comprising:
   a pre-driver stage driven by the up-converted signal;
   the pre-driver stage coupled to a power amplifier; and
   the power amplifier coupled to an antenna.

6. The transmitter of claim 1, wherein each baseband path comprises:
   a digital baseband signal coupled to a digital-to-analog converter;
   the digital-to-analog converter coupled to an adjustable gain amplifier; and
   the adjustable amplifier coupled to one of the low pass filters.

7. The transmitter of claim 1, further comprising:
   a reference external frequency coupled to a feedback loop;
   a control signal from the feedback loop coupled to the quadrature oscillator; and
   a high frequency oscillation signal coupled from the quadrature oscillator to the feedback loop.

8. A method of separating a second frequency from a minimum of a frequency band of a primary up-converted signal by a third frequency comprising the steps of:
   coupling an i-baseband path with a wide-band differential i-signal with a frequency range from DC to a first frequency provided to a first low pass filter and a first high pass filter;
   coupling a q-baseband path with a wide-band differential q-signal with the frequency range from DC to the first frequency provided to a second low pass filter and a second high pass filter;
   generating an differential in-phase oscillation signal with the second frequency and a differential quadrature oscillation signal with the second frequency by a quadrature oscillator, wherein the oscillation signals generated by the quadrature oscillator are coupled to a first and a second mixer;
   coupling the first low pass filter and the first high pass filter to the first mixer;
   coupling the second low pass filter and the second high pass filter to the second mixer, wherein all high pass filters have a cutoff frequency equal to the third frequency; and
   coupling a partial amplitude of the frequency range of the primary up-converted signal through a substrate-reactive coupled network into the quadrature oscillator, wherein
   the second frequency is separated from a minimum of a frequency band of the up-converted signal by the third frequency.

9. The method of claim 8, wherein
   setting the third frequency equal to a locking range of the quadrature oscillator.

10. The method of claim 8, further comprising the steps of:
    summing an output of a first up-converted signal from the first mixer with an output of a second up-converted signal from the second mixer to generate the primary up-converted signal.

11. The method of claim 10, further comprising the steps of:

adjusting a frequency circuit formed with an adjustable capacitance.

12. The method of claim 8, further comprising the steps of:
driving a pre-driver stage by the primary up-converted signal;
coupling the pre-driver stage to a power amplifier; and
coupling the power amplifier to an antenna.

13. The method of claim 8, further comprising the steps of:
coupling a digital baseband, signal to a digital-to-analog converter;
coupling the digital-to-analog converter to an adjustable gain amplifier; and
coupling the adjustable gain amplifier to one of the low pass filters.

14. The method of claim 8, further comprising the steps of:
applying a reference external frequency to a feedback loop;
coupling a control signal of the feedback loop to the quadrature oscillator; and
coupling a high frequency oscillation from the oscillator to the feedback loop.

* * * * *